United States Patent [19]
Jang et al.

[11] Patent Number: 5,599,740
[45] Date of Patent: Feb. 4, 1997

[54] DEPOSIT-ETCH-DEPOSIT OZONE/TEOS INSULATOR LAYER METHOD

[75] Inventors: Syun-Ming Jang, Hsin-Chu; Chen-Hua Yu, Keelung City, both of Taiwan

[73] Assignee: Taiwan Semiconductor Manufacturing Company, Ltd., Hsin-Chu, Taiwan

[21] Appl. No.: 558,491

[22] Filed: Nov. 16, 1995

[51] Int. Cl.$^6$ .................... H01L 21/283; H01L 21/302
[52] U.S. Cl. .................... 437/190; 437/195; 437/228; 437/238; 437/978
[58] Field of Search .................... 437/189, 190, 437/192, 194, 195, 228, 228 PL, 235, 238, 978; 257/758, 760

[56] References Cited

U.S. PATENT DOCUMENTS

| | | | |
|---|---|---|---|
| 4,717,687 | 1/1988 | Verma | 437/97 |
| 4,872,947 | 10/1989 | Wang et al. | 156/643 |
| 5,079,188 | 1/1992 | Kawai | 437/195 |
| 5,302,555 | 4/1994 | Yu | 437/235 |
| 5,352,630 | 10/1994 | Kim et al. | 437/195 |
| 5,354,715 | 10/1994 | Wang et al. | 437/238 |
| 5,399,389 | 3/1995 | Hieber et al. | 427/579 |
| 5,444,023 | 8/1995 | Homma | 437/195 |
| 5,518,959 | 5/1996 | Jang et al. | 437/190 |

OTHER PUBLICATIONS

Korczynski, E., et al., "Improved Sub–Micron Inter–Metal Dielectric Gap-Filling TEOS/Ozone APCVD", Microelectronics Manufacturing Tech., Jan. 1992, pp. 22–27.

Homma, T., et al., "A Fully Planarized Multilevel Interconnection Technology Using Semi–Selective Tetraethoxy Silane–Ozone ... ", J. Electrochem. Soc., vol. 140, No. 12, Dec. 1993, pp. 3591–3599.

Suzuki, M., et al., "A Fully Planarized Multilevel Interconnection Technology Using Selective TEOS–Ozone APCVD", IEEE IEDM Tech. Dig., Dec. 1992, pp. 293–296.

*Primary Examiner*—T. N. Quach
*Attorney, Agent, or Firm*—George O. Saile; Alek P. Szecsy

[57] ABSTRACT

A method for forming a gap-filling and self-planarizing silicon oxide insulator spacer layer within a patterned integrated circuit layer. Formed upon a semiconductor substrate is a patterned integrated circuit layer which is structured with a titanium nitride upper-most layer. The patterned integrated circuit layer also has at least one lower-lying layer formed of a material having a growth rate with respect to ozone assisted Chemical Vapor Deposited (CVD) silicon oxide layers greater than the growth rate of ozone assisted Chemical Vapor Deposited (CVD) silicon oxide layers upon titanium nitride. Formed within and upon the patterned integrated circuit layer is a silicon oxide insulator spacer layer deposited through an ozone assisted Chemical Vapor Deposition (CVD) process. The silicon oxide insulator spacer layer is formed until the surface of the titanium nitride upper-most layer is passivated with the silicon oxide insulator spacer layer. The silicon oxide insulator spacer layer is then etched from the surface of the titanium nitride upper-most layer. Finally, additional portions of the silicon oxide insulator spacer layer are sequentially deposited and etched until the surface of the silicon oxide insulator spacer layer over the lower layer(s) of the patterned integrated circuit layer is planar with the upper surface of the titanium nitride upper-most layer of the patterned integrated circuit layer.

21 Claims, 4 Drawing Sheets

5,599,740

DEPOSIT-ETCH-DEPOSIT OZONE/TEOS INSULATOR LAYER METHOD

BACKGROUND OF THE INVENTION

1. Field of the Invention

The present invention relates generally to insulator layers formed within integrated circuits. More particularly, the present invention relates to gap filling and self-planarizing silicon oxide insulator spacer layers selectively formed within patterned layers within integrated circuits.

2. Description of the Related Art

Integrated circuits are typically fabricated from semiconductor substrates upon whose surfaces are formed a multiplicity of active semiconductor regions. Within those active semiconductor regions are formed transistors, resistors, diodes and other electrical circuit elements. Those electrical circuit elements are interconnected internally and externally to the semiconductor substrates upon which they are formed through the use of patterned conductor metal layers which are separated by insulator layers.

In accord with the continuing evolutionary trend in semiconductor technology, patterned conductor metal layer linewidths and spacings within advanced semiconductor integrated circuits have continued to decrease while aspect ratios of those patterned conductor metal lines have continued to increase. As a result of these factors, it is frequently desirable in advanced semiconductor integrated circuits to develop methods and materials through which there may be formed between adjoining structures of patterned conductor metal layers insulator spacer layers which possess excellent gap filling and planarizing properties. Insulator spacer layers which possess excellent gap filling and planarizing properties are most likely to provide void free insulator spacer layers which need minimal additional processing prior to forming upon their surfaces additional layers and structures within the integrated circuit within which those insulator spacer layers are formed.

It is towards the goal of developing silicon oxide insulator spacer layers which possess excellent gap filling and planarizing properties that the present invention is generally directed.

Methods by which there may be formed upon semiconductor substrates various types of layers which have specific growth properties, such as gap filling and planarizing properties, are known in the art. For example, Verma in U.S. Pat. No. 4,717,687 describes a method for growing thermal oxides at different rates upon different portions of a semiconductor substrate. The method derives from different growth rates for thermal oxides grown from crystalline silicon semiconductor substrate regions in comparison with thermal oxides grown from metastable amorphous silicon semiconductor substrate regions.

In addition, Yu in U.S Pat. No. 5,302,555 discloses a method for preferentially depositing a silicon oxide coating on horizontal surfaces of structured semiconductor substrates. The method involves control of several parameters related to the gaseous reactant mixture from which is deposited the silicon oxide coating and several additional parameters related to design of the reactor within which is deposited the silicon oxide coating. Significant parameters which are controlled include the flow ratio of reactant gases, the reactor pressure and the geometry of the susceptor within the reactor.

Still further, Wang et al., in U.S. Pat. Nos. 4,872,947 and 5,354,715, and E. J. Korczyski et al., in "Improved Sub-Micron Inter-Metal Dielectric Gap-Filling TEOS/Ozone APCVD," Microelectronics Tech., January 1992, pp. 22–27, describe process methods and process hardware for forming planarizing silicon oxide insulating layers through an ozone assisted Chemical Vapor Deposition (CVD) process employing Tetra Ethyl Ortho Silicate (TEOS) as the silicon source material.

Most pertinent to the present invention, however, is the disclosure of Hieber et al. in U.S. Pat. No. 5,399,389. Hieber discloses a method for locally and globally planarizing a structured semiconductor substrate with a silicon oxide layer formed through an ozone activated Chemical Vapor Deposition (CVD) process. The method employs a structured semiconductor substrate fabricated from materials at the lower levels of the structure which have inherently increased growth rates for silicon oxide layers formed through an ozone activated Chemical Vapor Deposition (CVD) process. The method preferably employs a Boro Phospho Silicate Glass (BPSG) or a Phospho Silicate Glass (PSG) lower layer. Optionally, the method also employs a Plasma Enhanced Chemical Vapor Deposited (PECVD) silicon oxide upper layer to retard growth upon metallization layers which otherwise typically form upper layers of the structured semiconductor substrate.

Desirable in the art are methods and materials which expand from the Hiebert disclosure and yield silicon oxide insulator spacer layers which have excellent gap filling and self-planarizing properties. Most desirable are gap filling and self-planarizing silicon oxide insulator spacer layers which may be formed selectively between adjoining structures of a patterned layer, such as a patterned metal layer, within an advanced integrated circuit, but not upon the top surfaces of those adjoining structures.

SUMMARY OF THE INVENTION

A first object of the present invention is to provide a gap filling and self-planarizing silicon oxide insulator spacer layer selectively deposited between adjoining structures of a patterned layer within an integrated circuit, such as the adjoining structures of a patterned metal layer within an integrated circuit, but not on the surfaces of those adjoining structures.

A second object of the present invention is to provide a gap filling and self-planarizing silicon oxide insulator spacer layer in accord with the first object of the present invention, which silicon oxide insulator spacer layer is readily manufacturable.

A third object of the present invention is to provide a gap filling and self-planarizing silicon oxide insulator spacer layer in accord with the first object of the present invention and the second object of the present invention, which silicon oxide insulator spacer layer is economical.

In accord with the objects of the present invention, a method for forming a gap filling and self-planarizing silicon oxide insulator spacer layer is disclosed. To form the gap filling and self-planarizing silicon oxide insulator spacer layer of the present invention there is first formed upon a semiconductor substrate a patterned integrated circuit layer. The patterned integrated circuit layer is structured with an upper-most layer formed of titanium nitride and at least one lower-lying layer formed of a material having a more rapid growth rate with respect to ozone assisted Chemical Vapor Deposited (CVD) silicon oxide insulator layers than titanium nitride. Formed then within and upon the patterned integrated circuit layer is a silicon oxide insulator spacer layer deposited through an ozone assisted Chemical Vapor Deposition (CVD) process. The silicon oxide insulator spacer layer is formed until the surface of the titanium nitride upper-most layer is passivated with the silicon oxide insulator spacer layer. Next, the silicon oxide insulator spacer layer is etched from the surface of the titanium nitride upper-most layer. Finally, the preceding silicon oxide insulator spacer layer deposition and etching processes are sequentially repeated until the surface of the silicon oxide insulator spacer layer over the lower-lying layer(s) of the patterned integrated circuit layer is planar with the upper surface of the titanium nitride upper-most layer.

The gap filling and self-planarizing silicon oxide insulator spacer layer of the present invention is selectively deposited between adjoining structures of a patterned layer within an integrated circuit, such as the adjoining structures of a patterned metal layer within an integrated circuit, but not on the surfaces of those adjoining structures. By fabricating the patterned layer into which the silicon oxide insulator spacer layer of the present invention is formed from a titanium nitride upper-most layer which has a slower growth rate with respect to ozone assisted Chemical Vapor Deposited (CVD) silicon oxide layers than materials from which are formed lower-lying layers of the patterned integrated circuit layer, it is possible to efficiently fill and planarize the gaps within the patterned integrated circuit layer while providing minimal silicon oxide insulator spacer layer build-up on the upper-most layers of the patterned integrated circuit layer. By successively etching the silicon oxide insulator spacer layer build-up from the surfaces of the upper-most layers of the patterned integrated circuit layer and depositing additional thicknesses to the silicon oxide insulator spacer layer, the present invention provides a silicon oxide insulator spacer layer selectively deposited within a patterned integrated circuit layer, but not upon the surfaces of those structures which form the patterns of the patterned integrated circuit layer.

The method of the present invention provides a silicon oxide insulator spacer layer which is readily manufacturable. The method of the present invention employs successive deposition and etch cycles to provide a gap filling and self-planarizing silicon oxide insulator spacer layer formed within a patterned integrated circuit layer where upper-most layers of the structures of the patterned integrated circuit layer have less rapid growth rates with respect to ozone assisted Chemical Vapor Deposited (CVD) silicon oxide insulator layers than lower-lying layers of the structures of the patterned integrated circuit layer. The sequential and repeated deposition and etching processes of the present invention, as well as the materials from which are formed the upper-most layers and the lower-lying layers of the patterned integrated circuit layers within which is formed the silicon oxide insulator spacer layer of the present invention, are known in the art. Since no new manufacturing equipment, manufacturing processes or materials are needed in forming the silicon oxide insulator spacer layer of the present invention, the method by which is formed the silicon oxide insulator spacer layer of the present invention is manufacturable. For analogous reasons, the silicon oxide insulator spacer layer of the present invention is also economical.

BRIEF DESCRIPTION OF THE DRAWINGS

The accompanying drawings, which form a material part of this disclosure, show the following.

DESCRIPTION OF THE PREFERRED EMBODIMENT

Figure 1A:
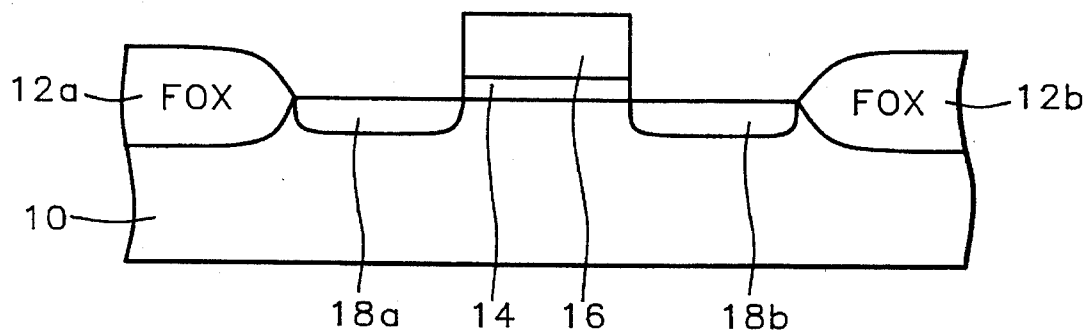
FIG. 1a to FIG. 1g illustrate progressive stages in forming an integrated circuit comprising the preferred embodiment of the present invention, into which integrated circuit are formed silicon oxide insulator spacer layers of the present invention.

The present invention provides a method for forming a gap filling and self-planarizing silicon oxide insulator spacer layer within, but not upon, integrated circuit structures which form patterned integrated circuit layers. The present invention provides a silicon oxide insulator spacer layer which is formed preferentially upon lower-lying layers of an integrated circuit structure within a patterned integrated circuit and not upon the surfaces of upper-most lying layers of that structure.

The viability of the method of the present invention derives from the substantial differences in growth rates that have been observed for ozone assisted Chemical Vapor Deposited (CVD) silicon oxide layers formed upon different substrate materials. These growth rate differences have been described in detail in other disclosures from this laboratory. For example, see S. M. Jang et al., "Method for Selectively Depositing Silicon Oxide Spacer Layers," U.S. patent application Ser. No. 08/518,706 filed Aug. 24, 1995, U.S. Pat. No. 5,518,959. Important to the present invention is the observation that ozone assisted Chemical Vapor Deposited (CVD) silicon oxide layers deposit substantially more rapidly upon aluminum containing conductor metal layers and Plasma Enhanced Chemical Vapor Deposited (PECVD) silicon oxide layers than upon titanium nitride layers.

By forming the structures of the patterned integrated circuit layers within which the gap filling and self-planarizing silicon oxide insulator layer of the present invention is deposited from lower-lying layers having a high growth rate for ozone assisted Chemical Vapor Deposited (CVD) silicon oxide layers and upper-most lying layers having a low growth rate for ozone assisted Chemical Vapor Deposited (CVD) silicon oxide layers, there may be formed the gap filling and self-planarizing silicon oxide insulator spacer layer of the present invention which is formed more rapidly between the structures of a patterned integrated circuit layer than upon the surfaces of those structures. In addition, by forming the gap filling and self-planarizing silicon oxide insulator spacer layer of the present invention through multiple deposition process steps separated by multiple intervening etch process steps, the thin gap filling and self-planarizing silicon oxide insulator spacer layer of the present invention which is formed upon the surface of a titanium nitride upper-most layer of the patterned integrated circuit layer structure may be removed. At the completion of multiple sequential deposition and etch process steps there is formed the gap filling and self-planarizing silicon oxide insulator spacer layer of the present invention.

The gap filling and self planarizing silicon oxide insulator spacer layer of the present invention may be formed within any integrated circuit wherein there is needed a gap filling and self-planarizing silicon oxide insulator spacer layer which is selectively formed between, but not upon, structures within patterned integrated circuit layers. Typically, although not exclusively, the gap filling and self-planarizing silicon oxide insulator spacer layer of the present invention will be formed within the structures of a patterned metal layer within an integrated circuit. The gap filling and self planarizing silicon oxide insulator spacer layer of the present invention may be used as a silicon oxide insulator spacer layer within a first patterned metal layer within an integrated circuit, within a second patterned metal layer within an integrated circuit or within any subsequent patterned metal layer(s) within an integrated circuit.

The gap filling and self-planarizing silicon oxide insulator spacer layer of the present invention also has broad applicability as a silicon oxide insulator spacer layer within various types of integrated circuits. The gap filling and self-planarizing silicon oxide insulator spacer layer of the present invention may be used in integrated circuits including but not limited to Dynamic Random Access Memory (DRAM) integrated circuits, Static Random Access Memory (SRAM) integrated circuits, Application Specific Integrated Circuits (ASICs), integrated circuits having field effect transistors formed within their structures and integrated circuits having bipolar transistors formed within their structures.

Referring now to FIG. 1a to FIG. 1g there is shown a series of schematic cross-sectional diagrams illustrating progressive stages in forming an integrated circuit which provides the preferred embodiment into which the silicon oxide insulator spacer layer of the present invention is formed. Shown in FIG. 1a is the integrated circuit at the early stages of fabrication.

FIG. 1a shows a semiconductor substrate 10 upon and within whose surface there are formed isolation regions 12a and 12b. Semiconductor substrates upon which the present invention may be practiced may be formed with either dopant polarity, any dopant concentration and any crystallographic orientation. Typically, the semiconductor substrate 10 upon which is practiced the present invention will be a N- or P-silicon semiconductor substrate having a (100) crystallographic orientation.

Methods by which isolation regions may be formed within and upon semiconductor substrates are known in the art. Such methods include but are not limited to methods whereby a portion of a semiconductor substrate exposed through an appropriate mask is oxidized to form isolation regions within and upon the semiconductor substrate, and methods whereby a separate insulating layer is formed upon a semiconductor substrate surface and subsequently patterned to form isolation regions upon the semiconductor substrate. For the preferred embodiment of the integrated circuit into which the silicon oxide insulator spacer layer of the present invention is formed, the isolation regions 12a and 12b are preferably formed through a thermal oxidation process whereby portions of the semiconductor substrate 10 exposed through an oxidation mask are consumed to form within and upon the semiconductor substrate 10 isolation regions 12a and 12b of silicon oxide.

Also illustrated within FIG. 1a is a gate oxide 14 upon which resides a gate electrode 16. Both the gate oxide 14 and the gate electrode 16 reside upon the active semiconductor region of the semiconductor substrate 10. Both the gate oxide 14 and the gate electrode 16 are components of a field effect transistor.

Methods and materials through which gate oxides and gate electrodes may be formed upon active semiconductor regions of semiconductor substrates are known in the art. Gate oxides may be formed through methods including but not limited to methods whereby the surface of the active semiconductor region of a semiconductor substrate is oxidized to form a blanket gate oxide layer upon the active semiconductor region, and methods whereby a blanket gate oxide layer is independently deposited upon the surface of the active semiconductor region. Excess portions of blanket gate oxide layers formed upon active semiconductor regions may be removed through etching processes conventional to the art.

Gate electrodes are typically formed via patterning and etching through methods as are conventional in the art of blanket layers of gate electrode materials which are formed upon the surfaces of blanket gate oxide layers. Typically, blanket layers of gate electrode materials are formed from highly conductive materials such as metals, metal alloys, highly doped polysilicon and polycides (polysilicon/metal silicide stacks).

For the preferred embodiment of the integrated circuit into which the silicon oxide insulator spacer layer of the present invention is formed, the gate oxide 14 is preferably formed through patterning of a blanket gate oxide layer formed through thermal oxidation of the active semiconductor region of semiconductor substrate 10 at a temperature of about 800 to about 1000 degrees centigrade to yield a typical blanket gate oxide layer thickness of about 80 to about 140 angstroms. For the preferred embodiment of the integrated circuit into which the silicon oxide insulator spacer layer of the present invention is formed, the gate electrode 16 is preferably formed by patterning and etching a blanket layer of highly doped polysilicon formed upon the blanket gate oxide layer at a thickness of about 2500 to about 3000 angstroms through a Chemical Vapor Deposition (CVD) process employing silane as the silicon source material, along with suitable dopant species. Once the blanket layer of highly doped polysilicon has been patterned to yield the gate electrode 16, the gate electrode may be used as an etch mask to pattern the gate oxide 14 from the blanket gate oxide layer.

Finally, there is shown in FIG. 1a source/drain electrodes 18a and 18b formed within the surface of the active semiconductor region of the semiconductor substrate 10 at areas not occupied by the gate electrode 16, the gate oxide 14 and the isolation regions 12a and 12b. Methods and materials through which source/drain electrodes may be formed within semiconductor substrates are known in the art. Such methods typically employ dopant species which are ionized and implanted into a semiconductor substrate at sufficient velocity and dose to form into the semiconductor substrate a region of conductivity sufficient for a source/drain electrode. The polarity desired for the source/drain electrode will dictate the polarity of the dopant species. Arsenic dopant species, boron dopant species and phosphorus dopant species are common in the art. For the preferred embodiment of the integrated circuit into which the silicon oxide insulator layer of the present invention is formed, the source/drain electrodes 18a and 18b are preferably formed through implanting a suitable dopant species into the active region of the semiconductor substrate 10 at about 4 E13 to about 7 E13 ions per square centimeter dose and about 100 to about 130 keV ion implantation energy.

Having formed a field effect transistor structure comprising source/drain electrodes 18a and 18b formed into the semiconductor substrate 10, and a gate electrode 16 upon a gate oxide 14 adjoining the source/drain electrodes 18a and 18b, the important process steps in forming the silicon oxide insulator spacer layer of the present invention may proceed. The results of those process steps are illustrated in FIG. 1b to FIG. 1f.

Figure 1B:
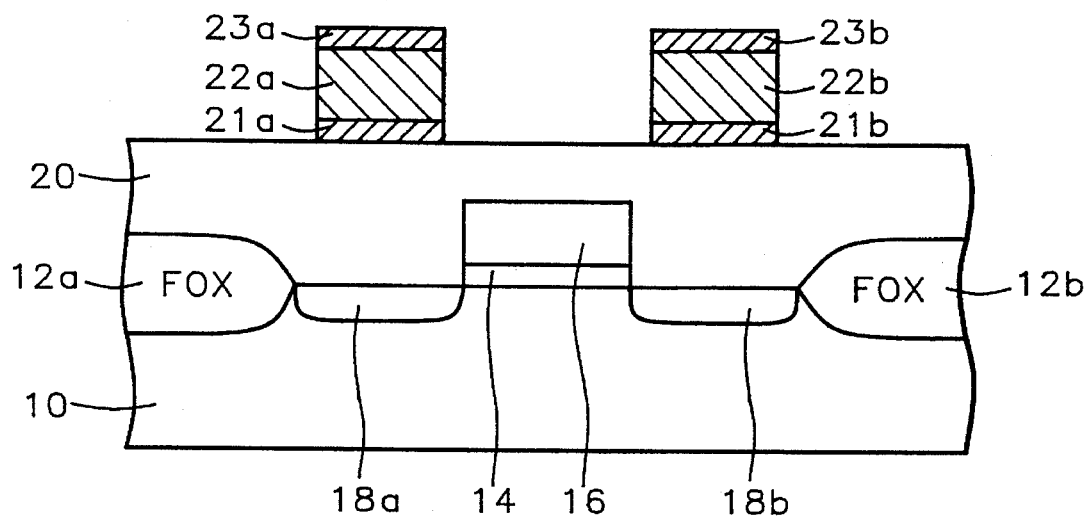

Shown in FIG. 1b is the presence of a planarized first silicon oxide insulator substrate layer 20 formed upon the semiconductor substrate 10 illustrated in FIG. 1a. Formed upon the planarized first silicon oxide insulator substrate layer 20 is a pair of three-layer patterned first metal stacks. Within the pair of three-layer patterned first metal stacks, there resides at the bottoms a pair of patterned first lower barrier metal layers 21a and 21b. Upon the patterned first lower barrier metal layers 21a and 21b resides a pair of patterned first conductor metal layers 22a and 22b, and upon the pair of patterned first conductor metal layers 22a and 22b resides a pair of patterned first upper barrier metal layers 23a and 23b. With the exception of the pair of patterned first lower barrier metal layers 21a and 21b, each of the component layers shown within FIG. 1b is important to the present invention.

In part, the viability of the preferred embodiment of the present invention derives from differences in growth rates of silicon oxide insulator spacer layers formed through ozone assisted Chemical Vapor Deposition (CVD) processes upon: (1) silicon oxide insulator substrate layers, (2) aluminum containing alloy conductor metal layers, and (3) titanium nitride barrier metal layers formed upon aluminum containing alloy conductor metal layers. In general, it is preferred for the present invention that the ratio of the growth rate of a silicon oxide insulator spacer layer formed through an ozone assisted Chemical Vapor Deposition (CVD) process upon a titanium nitride upper-most metal layer within a patterned integrated circuit with respect to the growth rate of that same silicon oxide insulator spacer layer upon an under-lying silicon oxide insulator substrate layer or aluminum containing alloy conductor metal layer within the same integrated circuit is no greater than about 1:2. In general, it is also preferred that the depth of the integrated circuit pattern into which is formed the gap filling and self-planarizing silicon oxide insulator spacer layer of the present invention is from about 5000 to about 10000 angstroms.

For the preferred embodiment of the present invention, the planarized first silicon oxide insulator substrate layer 20 is formed through planarizing a conformal first silicon oxide insulator substrate layer which is formed through a Plasma Enhanced Chemical Vapor Deposition (PECVD) process. Processes through which a conformal first silicon oxide insulator substrate layer may be planarized are known in the art. Typically, such process involve Reactive Ion Etch (RIE) planarizing or Chemical-Mechanical Polish (CMP) planarizing. Although it is not essential to the present invention that the planarized first silicon oxide insulator substrate layer 20 in fact be planarized, it is preferred due to the high aspect ratios and close spacings of patterned metal layers typical to advanced integrated circuits. Given the high aspect ratios and close spacings of those patterned metal layers, the advantages of the present invention are more readily realized upon planarized silicon oxide insulator substrate layers.

The Plasma Enhanced Chemical Vapor Deposition (PECVD) processes through which may be formed the planarized first silicon oxide insulator substrate layer 20 are known in the art to form dense and impervious conformal silicon oxide insulator substrate layers. In addition, several silicon source materials may be employed in forming the conformal first silicon oxide insulator substrate layer from which is formed the planarized first silicon oxide insulator substrate layer 20. Such silicon source materials include but are not limited to Tetra Ethyl Ortho Silicate (TEOS), silane, Octa Methyl Cyclo Tetra Siloxane (OMCTS) and Hexa Methyl Di-Silazane (HMDS). For economic and commercial reasons, the preferred materials from which the planarized first silicon oxide insulator substrate layer 20 is formed are silane and Tetra Ethyl Ortho Silicate (TEOS).

The next important elements to the present invention are the materials from which are formed the pair of patterned first conductor metal layers 22a and 22b, and the pair of patterned first upper barrier metal layers 23a and 23b. It is important to the present invention that the patterned first conductor metal layers 22a and 22b are formed from an aluminum containing alloy. Preferably the patterned first conductor metal layers 22a and 22b are formed of an aluminum containing alloy containing about 0.5 to about 1.0 percent copper. Preferably, the patterned first conductor metal layers 22a and 22b are formed at about 4000 to about 6000 angstroms thickness.

It is also important to the present invention that the pair of patterned first upper barrier metal layers 23a and 23b are formed of titanium nitride, preferably at a thickness of about 1000 to about 1400 angstroms. Although not important to the present invention, the pair of patterned first lower barrier metal layers 21a and 21b are also preferably formed from titanium nitride, preferably at a thickness of about 800 to about 1200 angstroms. Overall, the total thickness of the three-layer patterned first metal stacks within which is selectively formed the gap filling and self-planarizing silicon oxide insulator spacer layer of the present invention are about 5800 to about 8600 angstroms each.

Methods through which the patterned first lower barrier metal layers 21a and 21b, the patterned first conductor metal layers 22a and 22b and the patterned first upper barrier metal layers 23a and 23b may be formed upon the planarized first silicon oxide insulator substrate layer 20 are conventional to the art. Such methods include but are not limited to thermal evaporation methods, electron beam assisted evaporation methods, Chemical Vapor Deposition (CVD) methods and Physical Vapor Deposition (PVD) sputtering methods. Although these methods are in general applicable for forming all of the patterned metal layers within the pair of three-layer patterned first metal stacks, it is preferred that the titanium nitride patterned first lower barrier metal layers 21a and 21b and the titanium nitride patterned first upper barrier metal layers 23a and 23b be formed through a Physical Vapor Deposition (PVD) sputtering method.

Figure 1C:
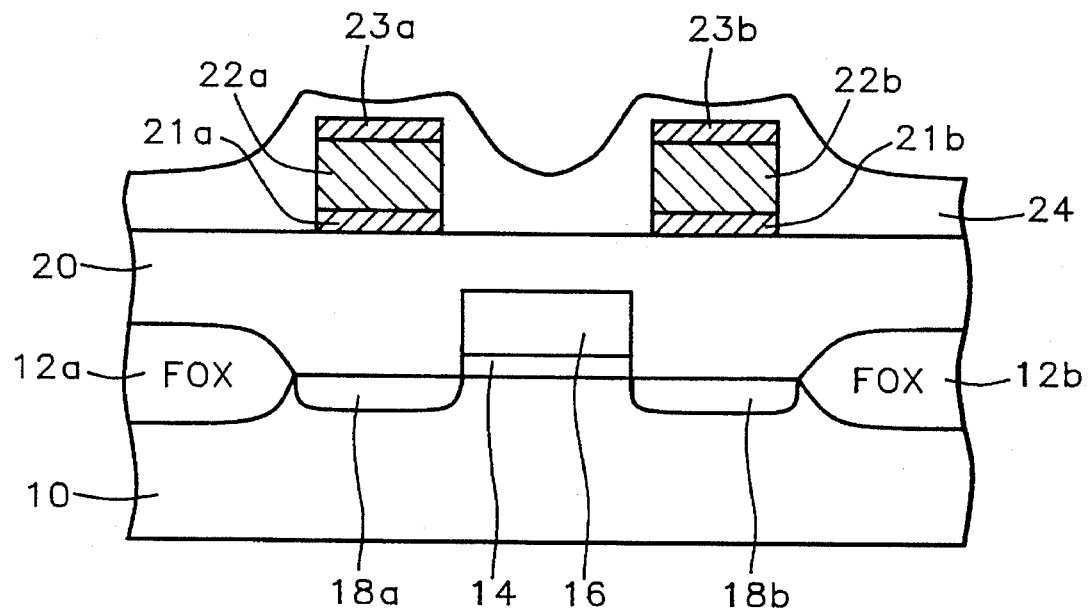

Upon forming the pair of three-layer patterned first metal stacks within the integrated circuit of the preferred embodiment of the present invention, there may then be formed the gap filling and self-planarizing silicon oxide insulator spacer layer of the present invention. The process steps through which is formed the gap filling and self-planarizing silicon oxide insulator spacer layer of the present invention are illustrated in FIG. 1c to FIG. 1f. Shown in FIG. 1c is a first gap filling and self-planarizing silicon oxide insulator spacer layer 24 of the present invention at its early stages of formation. Illustrated in FIG. 1c is the substantial thickness of the first gap filling and self-planarizing silicon oxide insulator spacer layer 24 over the planarized first silicon oxide insulator substrate layer 20 and adjoining the pair of patterned first conductor metal layers 22a and 22b. Also illustrated is the limited thickness of the first gap filling and self-planarizing silicon oxide insulator spacer layer 24 over the pair of patterned first upper barrier metal layers 23a and 23b.

It is important to the present invention that the first gap filling and self-planarizing silicon oxide insulator spacer layer 24 be formed through an ozone assisted Chemical Vapor Deposition (CVD) process employing Tetra Ethyl Ortho Silicate (TEOS) as the silicon source material, since it has been found experimentally that the ozone assisted Chemical Vapor Deposition (CVD) process provides the differential deposition rates needed for forming the gap filling and self-planarizing silicon oxide insulator spacer layer of the present invention.

The first gap filling and self-planarizing silicon oxide insulator spacer layer 24 is formed at a comparatively high ozone concentration. Preferably, the ozone:TEOS molar ratio is from about 12:1 to about 20:1. The remaining process parameters under which the first gap filling and self-planarizing silicon oxide insulator spacer layer 24 of the present invention is formed are a reactor pressure of about 350 to about 550 Torr, a Tetra Ethyl Ortho Silicate (TEOS) flow rate of about 27 to about 42 standard cubic centimeters per minute (sccm), a background helium flow rate of about 1850 to about 2750 standard cubic centimeters per minute (sccm), a deposition temperature of about 325 to about 475 degrees centigrade and an oxygen (ozone carrier gas) flow rate of about 4000 to about 6000 standard cubic centimeters per minute (sccm). The first gap filling and self-planarizing silicon oxide insulator spacer layer 24 of the present invention is formed until the surface of the titanium nitride patterned first upper barrier metal layers 23a and 23b are passivated. Typically, this passivation will include about 1000 to about 2000 angstroms of the first gap filling and self-planarizing silicon oxide insulator spacer layer 24 upon the surfaces of the pair of patterned first upper barrier metal layers 23a and 23b.

Figure 1D:
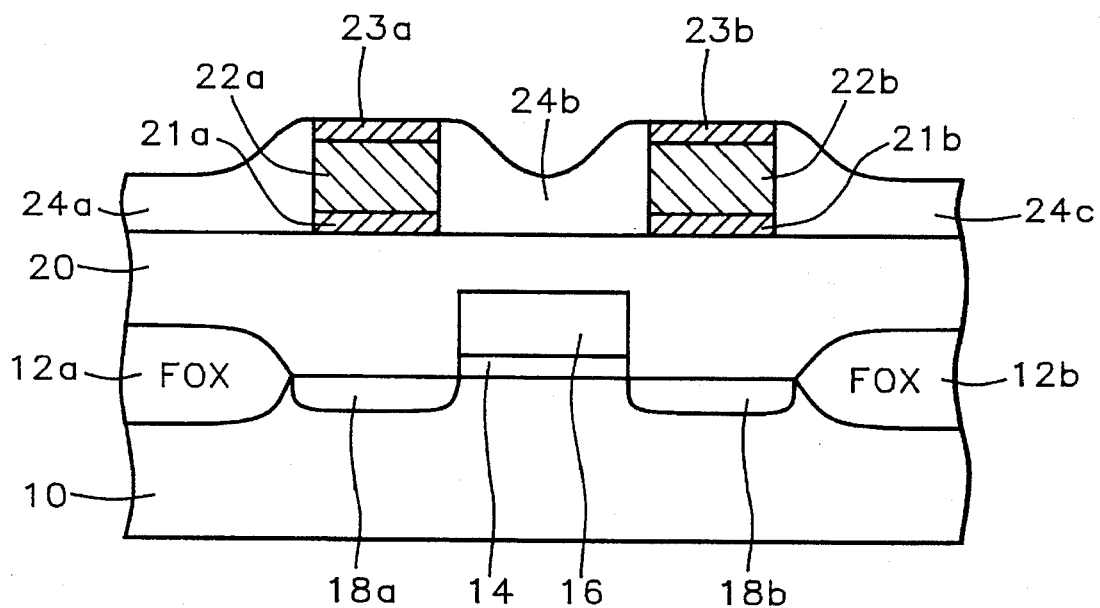

Referring now to FIG. 1d there is shown the results of the next process step in forming the gap filling and self-planarizing silicon oxide insulator spacer layer within the integrated circuit of the preferred embodiment of the present invention. Shown in FIG. 1d is the etching of the first gap filling and self-planarizing silicon oxide insulator spacer layer 24 to remove portions of that layer from the upper surfaces of the titanium nitride patterned first upper barrier metal layers 23a and 23b.

Methods and materials through which silicon oxide insulator spacer layers may be etched are known in the art. Such methods include but are not limited to wet chemical etch methods, Reactive Ion Etch (RIE) plasma etch methods and sputter etch methods employing non-reactive etchant gasses. For the preferred embodiment of the present invention, the first gap filling and self-planarizing silicon oxide insulator spacer layer 24 is preferably etched to form the patterned first gap filling and self-planarizing silicon oxide insulator spacer layers 24a, 24b and 24c through a Reactive Ion Etch (RIE) etch process employing fluorine containing etchant gasses. The first gap filling and selfplanarizing silicon oxide insulator spacer layer 24 is etched until portions of that layer are completely removed from the surfaces of the patterned first upper barrier metal layers 23a and 23b.

Figure 1E:
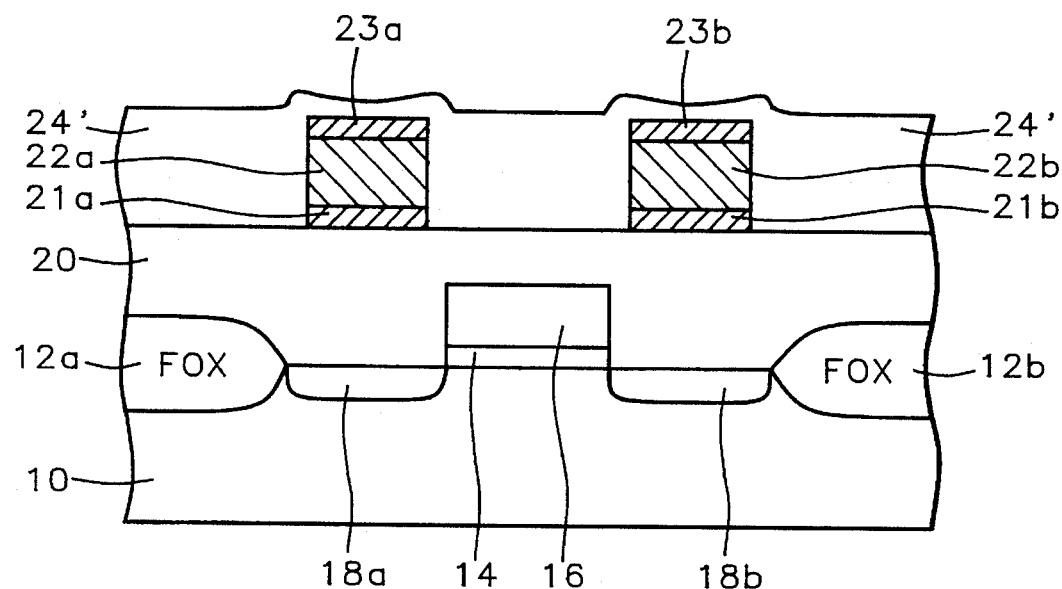

Referring now to FIG. 1e there is shown a schematic cross-sectional diagram illustrating the next process step in forming the gap filling and self-planarizing silicon oxide insulator spacer layer within the integrated circuit of the preferred embodiment of the present invention. Shown in FIG. 1e is an additional deposition of silicon oxide material to form the first gap filling and self-planarizing silicon oxide insulator spacer layer 24'. The additional silicon oxide material is deposited employing the materials, methods and parameters described for depositing the gap filling and self-planarizing silicon oxide insulator spacer layer 24 within FIG. 1c. The additional silicon oxide material is formed until the first gap filling and self-planarizing silicon oxide insulator spacer layer 24' forms a substantially planar surface over the planarized first silicon oxide insulator substrate layer 20 and the patterned first upper barrier metal layers 23a and 23b.

Figure 1F:
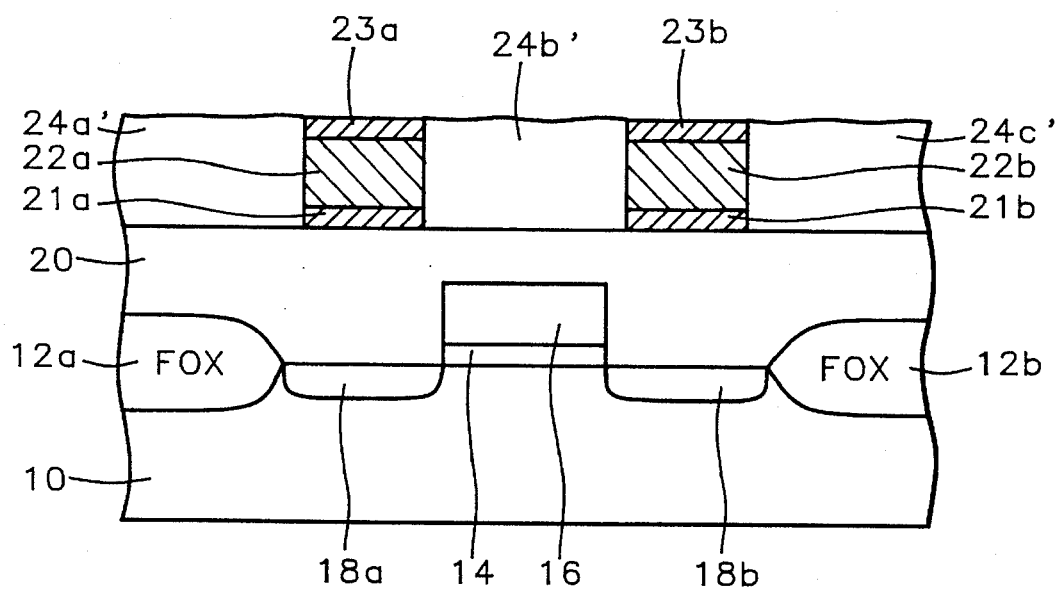

Referring now to FIG. 1f there is shown a schematic cross-sectional diagram illustrating the last step in forming the gap filling and self-planarizing silicon oxide insulator spacer layer within the integrated circuit of the preferred embodiment of the present invention. Shown in FIG. 1f are the results of etching the first gap filling and self-planarizing silicon oxide insulator spacer layer 24' of FIG. 1e. The etching is undertaken employing the same methods and materials that are employed in etching the first gap filling and self-planarizing silicon oxide insulator spacer layer 24 to form the patterned first gap filling and self-planarizing silicon oxide insulator spacer layers 24a, 24b and 24c. The first gap filling and self-planarizing silicon oxide insulator spacer layer 24' is etched for a sufficient time to completely expose the patterned first upper barrier metal layers 23a and 23b and provide a substantially planar surface to the semiconductor substrate 10 illustrated in FIG. 1f. Upon completion of this etching there is formed the patterned first gap filling and self-planarizing silicon oxide insulator spacer layers 24a', 24b' and 24c'.

As is understood by a person skilled in the art, it may be desirable to employ more than two sequential and repetitive deposit and etch steps in forming the gap filling and self-planarizing silicon oxide insulator spacer layer of the present invention, as illustrated in FIG. 1c to FIG. 1f. Several factors will influence the actual number of sequential and repetitive deposit and etch steps that are needed to most efficiently and effectively form the gap filling and self-planarizing silicon oxide insulator spacer layer of the present invention upon a given patterned integrated circuit layer upon a semiconductor substrate. These factors include but are not limited to: (1) the thickness of the gap filling and self-planarizing silicon oxide insulator spacer layer needed to passivate the titanium nitride upper barrier metal layers upon which the gap filling and self-planarizing silicon oxide insulator spacer layer is formed, and (2) the aspect ratios and heights of the structures within the integrated circuit pattern within which is formed the gap filling and self-planarizing silicon oxide insulator spacer layer of the present invention.

As is also understood by a person skilled in the art, additional planarized silicon oxide insulator substrate layers, additional multi-layer patterned metal stacks and additional gap filling and self-planarizing silicon oxide insulator spacer layers may be formed upon the semiconductor substrate 10 surface illustrated in FIG. 1f to yield additional layers of the integrated circuit which comprises the preferred embodiment into which the present invention is formed. Such additional layers and stacks are illustrated in FIG. 1g.

Figure 1G:
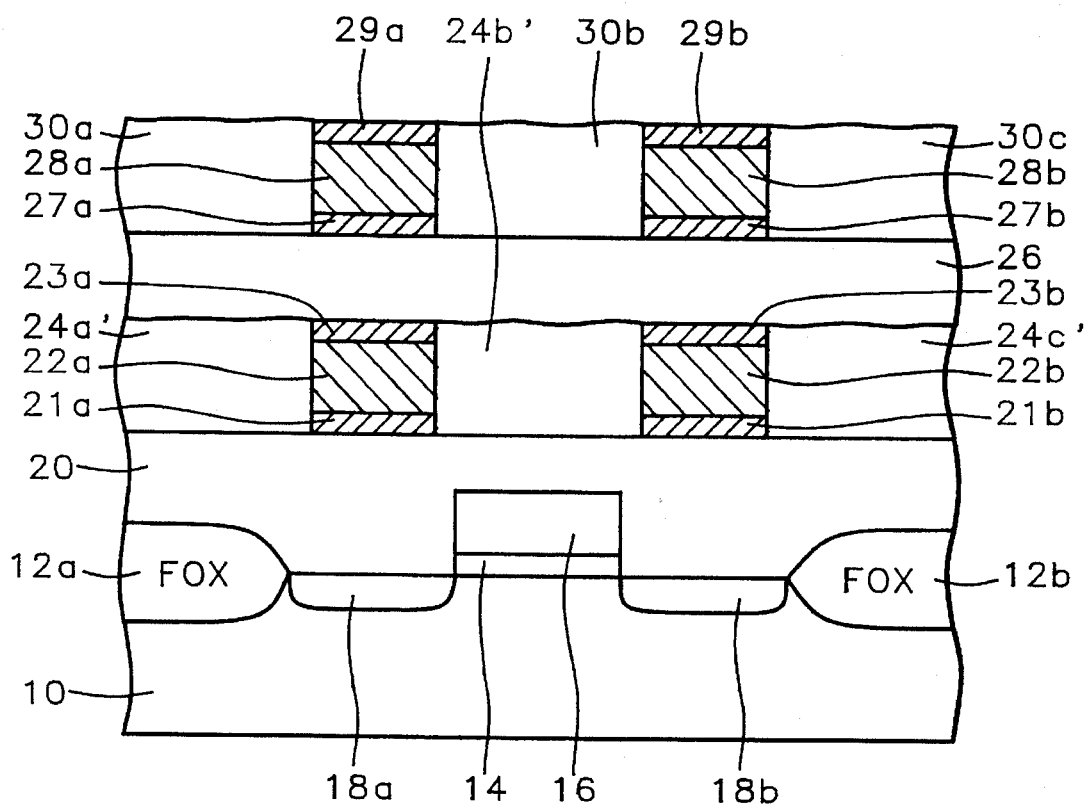

Illustrated in FIG. 1g is a planarized second silicon oxide insulator substrate layer 26; a pair of patterned second lower barrier metal layers 27a and 27b; a pair of patterned second conductor metal layers 28a and 28b; a pair of patterned second upper barrier metal layers 29a and 29b; and patterned second gap filling and self-planarizing silicon oxide insulator spacer layers 30a, 30b and 30c. The planarized second silicon oxide insulator substrate layer 26 may be formed through methods and materials equivalent to those employed in forming the planarized first silicon oxide insulator substrate layer 20. The pair of patterned second lower barrier metal layers 27a and 27b may be formed through methods and materials equivalent to those employed in forming the pair of patterned first lower barrier metal layers 21a and 21b. The pair of patterned second conductor metal layers 28a and 28b may be formed through methods and materials equivalent to those employed in forming the pair of patterned first conductor metal layers 22a and 22b. The pair of patterned second upper barrier metal layers 29a and 29b may be formed through methods and materials equivalent to those employed in forming the patterned first upper barrier metal layers 23a and 23b. Finally, the patterned second gap filling and self-planarizing silicon oxide insulator spacer layers 30a, 30b and 30c may be formed through methods and materials equivalent to those employed in forming the patterned first gap filling and self-planarizing silicon oxide insulator spacer layers 24a', 24b' and 24c'.

Upon forming the patterned second gap filling and self-planarizing silicon oxide insulator spacer layers 30a, 30b and 30c, there is formed the preferred embodiment of the present invention, which comprises an integrated circuit into which there is formed a multiplicity of gap filling and self-planarizing silicon oxide insulator spacer layers of the present invention.

As is understood by a person skilled in the art, the preferred embodiment into which the present invention is formed is illustrative of the present invention rather than limiting of the present invention. Revisions to methods and materials through which is formed the preferred embodiment may yield additional embodiments into which are formed gap filling and self-planarizing silicon oxide insulator spacer layers within the spirit and scope of the present invention.

EXAMPLES

Upon the surfaces of three (100) silicon semiconductor substrate wafers were formed planarized silicon oxide insulator substrate layers and three-layer patterned metal stacks in accord with the preferred embodiment of the present invention.

The planarized silicon oxide insulator substrate layers were formed through a Plasma Enhanced Chemical Vapor Deposition (PECVD) process employing Tetra Ethyl Ortho Silicate (TEOS) as the silicon source material. The process parameters included a Tetra Ethyl Ortho Silicate flow rate of about 800 standard cubic centimeters per minute (sccm), an oxygen flow rate of about 600 standard cubic centimeters per minute (scmm) and a radio frequency power of about 675 watts.

Upon the planarized silicon oxide insulator substrate layers were formed titanium nitride patterned lower barrier metal layers through a Physical Vapor Deposition (PVD) sputtering process employing a titanium nitride target. The titanium nitride patterned lower barrier metal layers were about 1000 angstroms thick each.

Upon the titanium nitride patterned lower barrier metal layer were formed aluminum containing alloy patterned conductor metal layers through a Physical Vapor Deposition (PVD) sputtering process. The aluminum containing alloy patterned conductor metal layers were formed at a thickness of about 4000 angstroms from an aluminum alloy containing about 1 percent copper.

Upon the aluminum containing alloy patterned conductor metal layers were formed titanium nitride patterned conductor metal layers through a Physical Vapor Deposition (PVD) sputtering process employing a titanium target. The titanium nitride patterned upper barrier metal layers were about 1200 angstroms thick each.

Upon each of the three semiconductor wafers having the equivalent planarized silicon oxide insulator substrate layers and the equivalent three-layer patterned metal stacks was then formed a silicon oxide insulator spacer layer in accord with the parameters preferred for the present invention. The silicon oxide insulator spacer layers were formed through an ozone assisted Chemical Vapor Deposition (CVD) process employing Tetra Ethyl Ortho Silicate (TEOS) as the silicon source material and an ozone:TEOS molar ratio of about 14:1, although higher ozone:TESO ratio are also achievable and desirable. Additional parameters under which those silicon oxide insulator spacer layers were formed included a reactor chamber pressure of about 450 Torr, a Tetra Ethyl Ortho Silicate (TEOS) flow of about 35 standard cubic centimeters per minute (sccm), a background helium flow rate of about 2300 standard cubic centimeters per minute (sccm), a temperature of about 400 degrees centigrade and an oxygen flow rate (ozone carrier gas) of about 5000 standard cubic centimeters per minute (sccm). Each the three individual silicon oxide insulator spacer layers was formed upon the three equivalent semiconductor substrate wafers for a different time interval. The time intervals were 50 second, 150 second and 300 seconds.

After the three silicon oxide insulator spacer layers were formed upon the three equivalent semiconductor substrates at the three different time intervals, there was measured: (1) the thickness of the silicon oxide insulator spacer layers over the planarized silicon oxide insulator substrate layers; (2) the thickness of the three silicon oxide insulator spacer layers adjoining the exposed edges of the aluminum containing alloy patterned conductor metal layers; and, (3) the thickness of the three silicon oxide insulator spacers layers over the titanium nitride patterned upper barrier metal layers. For the semiconductor substrate upon which the silicon oxide insulator spacer layer was formed for 50 seconds, there was no silicon oxide insulator spacer layer formed upon the titanium nitride patterned upper barrier metal layers.

Figure 2:
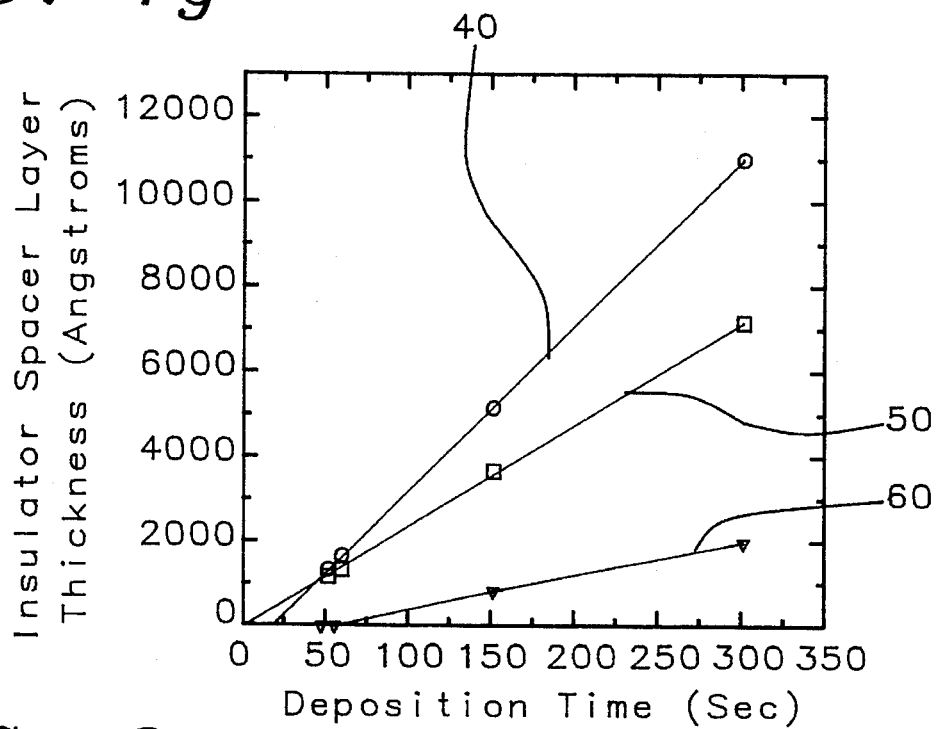
FIG. 2 shows a graph of Insulator Spacer Layer Thickness vs. Deposition Time for forming the silicon oxide insulator spacer layers of the present invention upon the substrate layers of the preferred embodiment of the present invention.

The measured thickness described above were plotted to yield the graph of FIG. 2. Within FIG. 2, reference numeral 40 corresponds to a plotted line of the thickness of the silicon oxide insulator spacer layers over the planarized silicon oxide insulator substrate layers. In addition, reference numeral 50 corresponds to a plotted line of the thickness of the three silicon oxide insulator spacer layers adjoining the exposed edges of the aluminum containing alloy patterned conductor metal layers. Finally, reference numeral 60 corresponds to a plotted line of the thickness of the three silicon oxide insulator spacer layers over the titanium nitride patterned upper barrier metal layers. From the three plotted lines which correspond to reference numeral 40, reference numeral 50 and reference numeral 60 within the graph of FIG. 2 were calculated: (1) the slopes which correspond to the deposition rates of the silicon oxide insulator spacer layers upon the individual substrate materials; and, (2) the x-axis intercepts which correspond to the incubation times for forming the silicon oxide insulator spacer layers upon those individual substrate materials. The deposition rates and incubation times are reported in TABLE I.

TABLE I

O3-TEOS SPACER LAYER FORMATION RATES AND INCUBATION TIMES

| Substrate Layer | Deposition Rate | Incubation Time |
| --- | --- | --- |
| Titanium Nitride | 513 angstroms/min. | 52.7 seconds |
| Aluminum 1% Copper | 1442 | 0.0 |
| PECVD - TEOS | 2280 | 15.6 |

From review of the data in TABLE I it is seen that the deposition rate of the ozone assisted Chemical Vapor Deposited (CVD) silicon oxide insulator spacer layer upon the titanium nitride upper barrier metal layer substrate is exceedingly low in comparison with the corresponding deposition rates for the silicon oxide insulator spacer layer upon either the aluminum containing alloy conductor metal substrate or the Plasam Enhanced Chemical Vapor Deposited (PECVD) planarized silicon oxide insulator substrate layer. Given this ordering of deposition rates, and the presence of a substantial incubation time for forming the silicon oxide insulator spacer layers upon titanium nitride barrier metal layers, the gap filling and self-planarizing silicon oxide insulation spacer layers of the present invention may be readily formed between but not upon patterned metal layers within advanced integrated circuits.

What is claimed is:

1. A method for forming a silicon oxide insulator spacer layer within a patterned integrated circuit layer upon a semiconductor substrate comprising:

(a) forming upon a semiconductor substrate a patterned integrated circuit layer, the patterned integrated circuit layer being structured with a titanium nitride upper-most layer, the titanium nitride upper-most layer having a first growth rate with respect to ozone assisted Chemical Vapor Deposited (CVD) silicon oxide layers, the patterned integrated circuit layer also having at least one lower-lying layer formed of a material having a second growth rate with respect to ozone assisted Chemical Vapor Deposited (CVD) silicon oxide layers, the second growth rate being greater than the first growth rate;

(b) forming within and upon the patterned integrated circuit layer a silicon oxide insulator spacer layer through an ozone assisted Chemical Vapor Deposition (CVD) process, the silicon oxide insulator spacer layer being formed until the surface of the titanium nitride upper-most layer is passivated with the silicon oxide insulator spacer layer;

(c) etching the silicon oxide insulator spacer layer from the surface of the titanium nitride upper-most layer; and (d) sequentially repeating step (b) and step (c) until the surface of the silicon oxide insulation spacer layer over the lower-lying layer(s) of the patterned integrated circuit layer is planar with the upper surface of the titanium nitride upper-most layer.

2. The method of claim 1 wherein the titanium nitride upper-most layer is from about 1000 to about 1400 angstroms thick.

3. The method of claim 1 wherein the titanium nitride upper-most layer is formed through a Physical Vapor Deposition (PVD) sputtering process.

4. The method of claim 1 wherein the depth of the integrated ciruit pattern is from about 5000 to about 10000 angstroms.

5. The method of claim 1 wherein the lower-lying layer(s) is formed from a material chosen from the group of materials consisting of aluminum, aluminum alloys and silicon oxide formed through a Plasma Enhanced Chemical Vapor Deposition (PECVD) method.

6. The method of claim 1 wherein the ratio of the first growth rate to the second growth rate is no greater than about 1:2.

7. The method of claim 1 wherein the ozone assisted Chemical Vapor Deposition (CVD) process employs Tetra Ethyl Ortho Silicate (TEOS) as a silicon material.

8. The method of claim 7 wherein the ozone assisted Chemical Vapor Deposition (CVD) process employs an ozone:TEOS molar ratio of about 12:1 to about 20:1.

9. The method of claim 1 wherein the etching is accomplished through a Reactive Ion Etch (RIE) process employing fluorine containing etchant gasses.

10. A method for forming a silicon oxide insulation spacer layer between multi-layer patterned metal stacks upon a semiconductor substrate comprising:

(a) forming upon a semiconductor substrate a silicon oxide insulator substrate layer, the silicon oxide insulator substrate layer being formed through a Plasma Enhanced Chemical Vapor Deposition (PECVD) process;

(b) forming upon the silicon oxide insulator substrate layer a series of multi-layer patterned metal stacks which expose a portion of the silicon oxide insulator substrate layer, the series of multi-layer patterned metal stacks having as their upper-most layers a series of titanium nitride upper barrier metal layers, the series of multi-layer patterned metal stacks also having as their lower-layers a series of alumnium containing alloy conductor metal layers;

(c) forming within and upon the series of multi-layer patterned metal stacks and upon the portion of the silicon oxide insulator substrate layer exposed through the series of multi-layer patterned metal stacks a silicon oxide insulator spacer layer through an ozone assisted Chemical Vapor Deposition (CVD) process, the silicon oxide insulator spacer layer being formed until the surfaces of the series of titanium nitride upper barrier metal layers are passivatived with the silicon oxide insulator spacer layer;

(d) etching the silicon oxide insulator spacer layer from the surfaces of the series of titanium nitride upper barrier metal layers; and (e) sequentially repeating step (c) and step (d) until the surface of the silicon oxide insulator spacer layer over the silicon oxide insulator substrate layer is planar with the upper surfaces of the series of titanium nitride upper barrier metal layers.

11. The method of claim 10 wherein the silicon oxide insulator substrate layer is formed through a Plasma Enhanced Chemical Vapor Deposition (PECVD) process employing Tetra Ethyl Ortho Silicate (TEOS) as a silicon source material.

12. The method of claim 10 wherein the height of the series of multi-layer patterned metal stacks is from about 5800 to about 8600 angstroms each.

13. The method of claim 10 wherein the series of titanium nitride upper barrier metal layers are from about 1000 to about 1400 angstroms thick each.

14. The method of claim 10 wherein the series of titanium nitride upper barrier metal layers are formed through a Physical Vapor Deposition (PVD) sputtering process.

15. The method of claim 10 wherein the series of aluminum containing alloy conductor metal layers is from about 4000 to about 6000 angstroms thick each.

16. The method of claim 10 wherein the series of aluminum containing alloy conductor metal layers is formed from an aluminum alloy containing about 0.5 to about 1.0% copper.

17. The method of claim 10 wherein the ozone assisted Chemical Vapor Deposition (CVD) process employs Tetra Ethyl Ortho Silicate (TEOS) as a silicon source material.

18. The method of claim 17 wherein the ozone assisted Chemical Vapor Deposition (CVD) process employs an ozone:TEOS molar ratio of about 12:1 to about 20:1.

19. The method of claim 10 wherein the etching is accomplished through a Reactive Ion Etch (RIE) process employing fluorine containing etchant gasses.

20. The method of claim 10 wherein the series of mutilayer patterned metal stacks form a patterned first conductor metal layer within an integrate circuit.

21. The method of claim 10 wherein the series of multi-layer patterned metal stacks form a patterned conductor metal layer other than a patterned first conductor metal layer within an integrated circuit.

* * * * *